APPARATUS FOR CHECKING LOGICAL CONNECTIVE CIRCUITS

Filed Oct. 18, 1965 4 Sheets-Sheet 1

INVENTOR
ALAN R. GELLER
BY Melvin P. Williams
ATTORNEY

APPARATUS FOR CHECKING LOGICAL CONNECTIVE CIRCUITS

Filed Oct. 18, 1965 4 Sheets-Sheet 2

Aug. 5, 1969 A. R. GELLER 3,459,927

APPARATUS FOR CHECKING LOGICAL CONNECTIVE CIRCUITS

Filed Oct. 18, 1965 4 Sheets-Sheet 3

FIG. 6

VALUE OF X

| VALUE OF Y | | a | b | c | d | e | f | g | h |
|---|---|---|---|---|---|---|---|---|---|
| | | 0 0 0 P | 0 0 1 | 0 1 0 | 0 1 1 P | 1 0 0 | 1 0 1 P | 1 1 0 P | 1 1 1 |
| A | 0 0 0 P | 0 0 0 P<br>0 0 0 P | 0 0 1<br>0 0 0 P | 0 1 0<br>0 0 0 P | 0 1 1 P<br>0 0 0 P | 1 0 0<br>0 0 0 P | 1 0 1 P<br>0 0 0 P | 1 1 0 P<br>0 0 0 P | 1 1 1<br>0 0 0 P |
| B | 0 0 1 | 0 0 1<br>0 0 0 P | 0 0 1<br>0 0 1 | 0 1 1 P<br>0 0 0 P | 0 1 1 P<br>0 0 1 | 1 0 1 P<br>0 0 0 P | 1 0 1 P<br>0 0 1 | 1 1 1<br>0 0 0 P | 1 1 1<br>0 0 1 |
| C | 0 1 0 | 0 1 0<br>0 0 0 P | 0 1 1 P<br>0 0 0 P | 0 1 0<br>0 1 0 | 0 1 1 P<br>0 1 0 | 1 1 0 P<br>0 0 0 P | 1 1 1<br>0 0 0 P | 1 1 0 P<br>0 1 0 | 1 1 1<br>0 1 0 |
| D | 0 1 1 P | 0 1 1 P<br>0 0 0 P | 0 1 1 P<br>0 0 1 | 0 1 1 P<br>0 1 0 | 0 1 1 P<br>0 1 1 P | 1 1 1<br>0 0 0 P | 1 1 1<br>0 0 1 | 1 1 1<br>0 1 0 | 1 1 1<br>0 1 1 P |
| E | 1 0 0 | 1 0 0<br>0 0 0 P | 1 0 1 P<br>0 0 0 P | 1 1 0 P<br>0 0 0 P | 1 1 1<br>0 0 0 P | 1 0 0<br>1 0 0 | 1 0 1 P<br>1 0 0 | 1 1 0 P<br>1 0 0 | 1 1 1<br>1 0 0 |
| F | 1 0 1 P | 1 0 1 P<br>0 0 0 P | 1 0 1 P<br>0 0 1 | 1 1 1<br>0 0 0 P | 1 1 1<br>0 0 1 | 1 0 1 P<br>1 0 0 | 1 0 1 P<br>1 0 1 P | 1 1 1<br>1 0 0 | 1 1 1<br>1 0 1 P |
| G | 1 1 0 P | 1 1 0 P<br>0 0 0 P | 1 1 1<br>0 0 0 P | 1 1 0 P<br>0 1 0 | 1 1 1<br>0 1 0 | 1 1 0 P<br>1 0 0 | 1 1 1<br>1 0 0 | 1 1 0 P<br>1 1 0 P | 1 1 1<br>1 1 0 P |
| H | 1 1 1 | 1 1 1<br>0 0 0 P | 1 1 1<br>0 0 1 | 1 1 1<br>0 1 0 | 1 1 1<br>0 1 1 P | 1 1 1<br>1 0 0 | 1 1 1<br>1 0 1 | 1 1 1<br>1 1 0 P | 1 1 1<br>1 1 1 |

United States Patent Office 3,459,927

Patented Aug. 5, 1969

3,459,927

APPARATUS FOR CHECKING LOGICAL CONNECTIVE CIRCUITS

Alan R. Geller, Poughkeepsie, N.Y., assignor to International Business Machines Corporation, Armonk, N.Y., a corporation of New York Filed Oct. 18, 1965, Ser. No. 497,257
Int. Cl. G06f *11/08*
U.S. Cl. 235—153 7 Claims

ABSTRACT OF THE DISCLOSURE

Disclosed is a logical unit which generates, at all times, the logical AND and the logical OR of a pair of operands applied thereto. The results of the AND or the OR so generated are selectively manifested in a result register only when a corresponding AND operation or OR operation is selected, respectively. Error checking is performed on the selected AND or OR operation by examining the outputs of the logical AND circuitry and the outputs of the logical OR circuitry to determine the parity thereof, and each of these parities is combined in an EXCLUSIVE OR circuit with a parity bit for each of the operands. When the EXCLUSIVE OR circuit has an output, that output is indicative of an error.

This invention relates to data processing, and more particularly to apparatus for checking the operation of logical connective, or logical function circuits.

In the data processing art, a central processing unit frequently includes logical circuitry for performing the logical OR, AND, and EXCLUSIVE OR, as well as other logical functions, on pairs of operands. It is well known in the art, that the result of such a logical function has a parity (even or odd) which may have added to it a parity bit which bit is given a generated value (1 or 0) for establishing a predetermined parity (even or odd) when that added bit and the result are examined together. The parity of the results or the added parity bit may be used elsewhere in the system so as to provide a check on the correct transfer of the logical result to said other part of the system. However, it has heretofor been difficult to determine whether or not the logical circuitry has generated a correct logical result in a first instance.

Accordingly, the primary object of this invention is to provide apparatus for checking results obtained by circuitry which performs logical functions on a pair of operands.

This invention is based upon the concept that the parity of the logical AND bears a relationship to the parity of the logical OR such that these two parities together with the parities of two operands applied to the logical OR and to the logical AND should total an even number; stated alternatively, if an EXCLUSIVE OR circuit generates a signal in response to the parity of a first operand, the parity of a second operand, the parity of the result of the logical AND of the operands, and the parity of the result of the logical OR of the operands, then that signal equals an error signal.

In accordance with the present invention, a logical unit generates, at all times, the logical AND and the logical OR of a pair of operands applied thereto, and the results so generated are selectively manifested in a result latch only when a corresponding AND operation or OR operation is called for, respectively. The outputs of the logical AND circuitry and the outputs of the logical OR circuitry are examined to determine the parity thereof, and each of these parities is combined in an EXCLUSIVE OR circuit with the parity bit for each of the operands. The output of the EXCLUSIVE OR circuit is taken to be an error.

The invention provides a very simple means of providing a check on the operation of logical function circuits, thereby permitting greater reliability at relatively low cost.

The foregoing and other objects, features and advantages of the present invention will become more apparent in the light of the following detailed description of a preferred embodiment thereof, as illustrated in the accompanying drawings.

In the drawings:

FIG. 6 is a table illustrating the concept of the invention.

Figure 1:
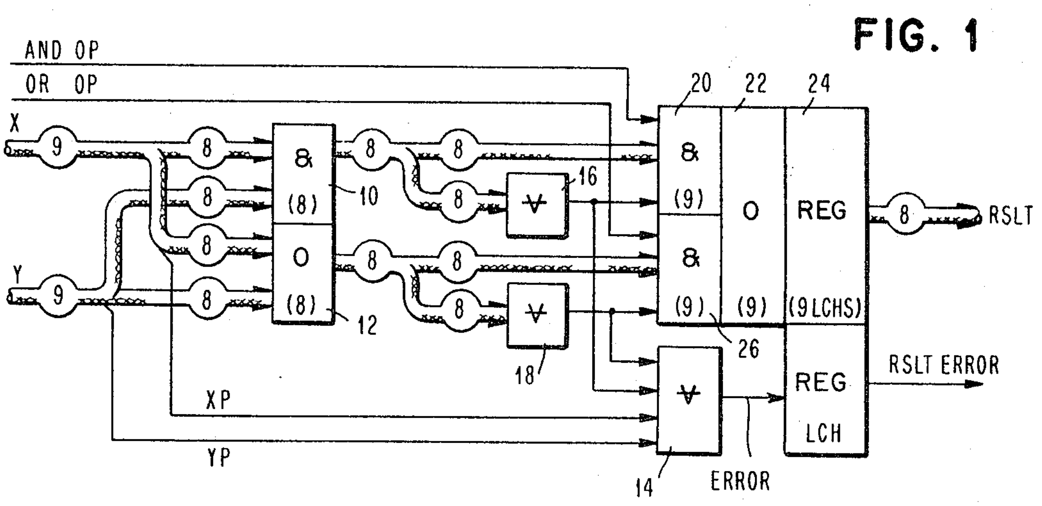
FIG. 1 is a schematic block diagram of an illustrative embodiment of the present invention.

Referring now to FIG. 1, two operands (sets of data input bits) are supplied on corresponding source buses (X, Y), each operand comprises eight data bits and an accompanying parity bit. Each of the data bits in each of the operands are applied to both the logical AND circuits 10 and the logical OR circuits 12. The parity bits are applied to an EXCLUSIVE OR circuit 14. Each output of the logical AND circuits 10 is applied to an EXCLUSIVE OR circuit 16, and each output of the logical OR circuits 12 is applied to an EXCLUSIVE OR circuit 18. Each output of the logical AND circuits 10 is also applied to a corresponding one of a plurality of input gating AND circuits 20, so that when these input gating AND circuits are energized in response to a signal on an AND OP line, a plurality of related OR circuits 22 will cause the setting of corresponding latches 24 in a register (REG). The gating circuitry 20, 22 is also responsive to the corresponding resulting parity bit from the EXCLUSIVE OR 16. In a similar fashion, input gating AND circuits 26 may also cause the operation of the OR circuits 22 whenever there is a signal present on the OR OP line. In other words, the latches 24 in the register will respond either to the logical AND circuits 10 or to the logical OR circuits 12 as well as the related parity bits from the EXCLUSIVE OR circuits 16, or 18, respectively. The outputs of the EXCLUSIVE OR circuits 16, 18 are also applied to the EXCLUSIVE OR circuit 14 such that there is always generated a signal on an ERROR line whenever there is an odd number of inputs to the EXCLUSIVE OR circuit 14. Thus, without regard to whether an AND or an OR operation is involved, the logical AND circuits 10 and their related EXCLUSIVE OR circuit 16 as well as the logical OR circuits 12 and their related EXCLUSIVE OR circuit 18 always generate outputs, therefore providing the inputs to the EXCLUSIVE OR circuit 14 in each case. However, the outputs of the logical AND circuits 10 and the logical OR circuits 12 are used selectively, in dependence upon the presence of signals on the AND OP or OR OP lines, alternatively. If neither the AND OP or the OR OP is involved, the latches 24 will not be set. Each of the circuits of FIG. 1 is shown in more detail in FIGS. 3–5, the content of which are described hereinbelow.

Figure 3:
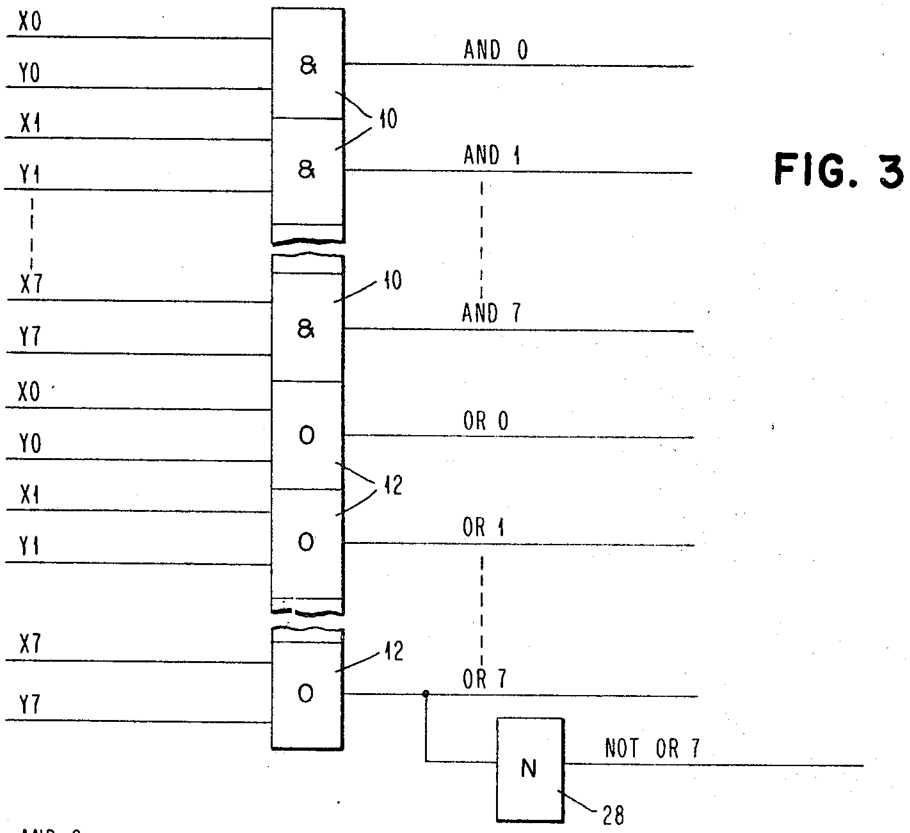
FIG. 3 is a schematic block diagram of the logical functions for the embodiment of FIG. 1.

Referring now to FIG. 3, a plurality of AND circuits 10 each respond to corresponding bits of the X input source and the Y input source to generate signals on the AND 0, AND 1 . . . AND 7 lines. Similarly, a plurality of OR circuits 12 generates signals on related OR 0, OR 1, . . . OR 7 lines in response to related pairs of similar input bits such as X0, Y0. In order to facilitate the circuitry herein, the complements of each output signal of the AND circuits 10 and the OR circuits 12 would be provided as illustrated by an INVERTER circuit 28 (N).

Figure 4:
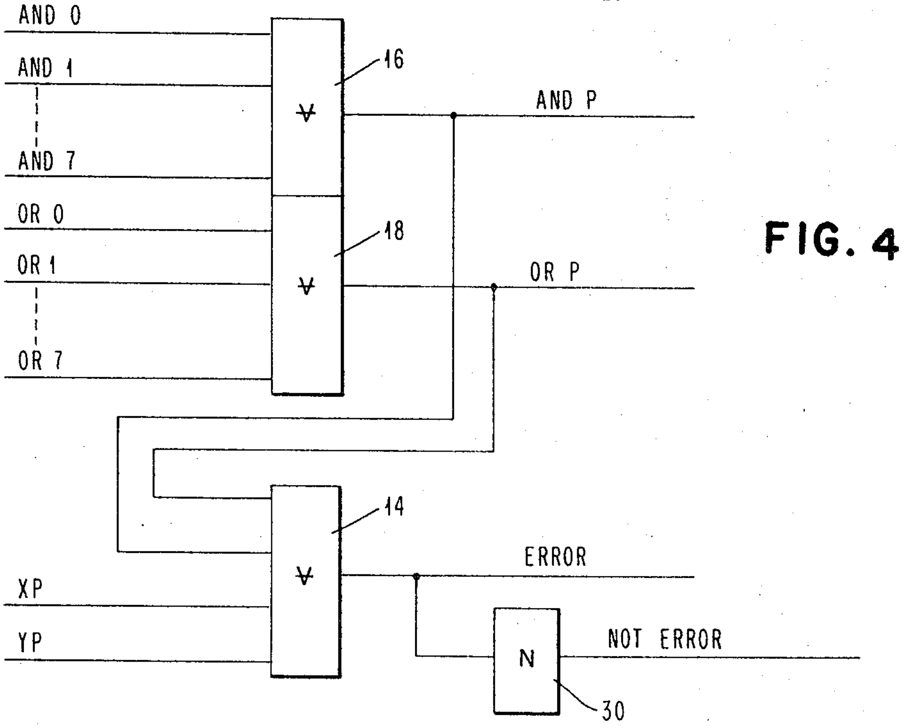
FIG. 4 is a schematic block diagram of parity generating circuits for the embodiment of FIG. 1.

The output of the circuitry of FIG. 3 is applied to the EXCLUSIVE OR circuits 16, 18 as shown in FIG. 4. The output of these EXCLUSIVE OR circuits is applied to the EXCLUSIVE OR circuit 14, along with the X and Y input parity bits. Thus, parity for the logical AND and parity for the logical OR are independently generated so as to be selectable for use as parity of the result in dependence upon whether an AND OP or an OR OP is involved; however, these are both generated at all times so as to be available to the EXCLUSIVE OR circuit 14, the output of which indicates error in either the AND circuits or the OR circuits without regard to which of these is selected as a result. The output of the EXCLUSIVE OR 14 comprises a signal on the ERROR line, which is also utilized by an inverter 30 to generate a signal on a NOT ERROR line as a complement thereto.

Figure 5:
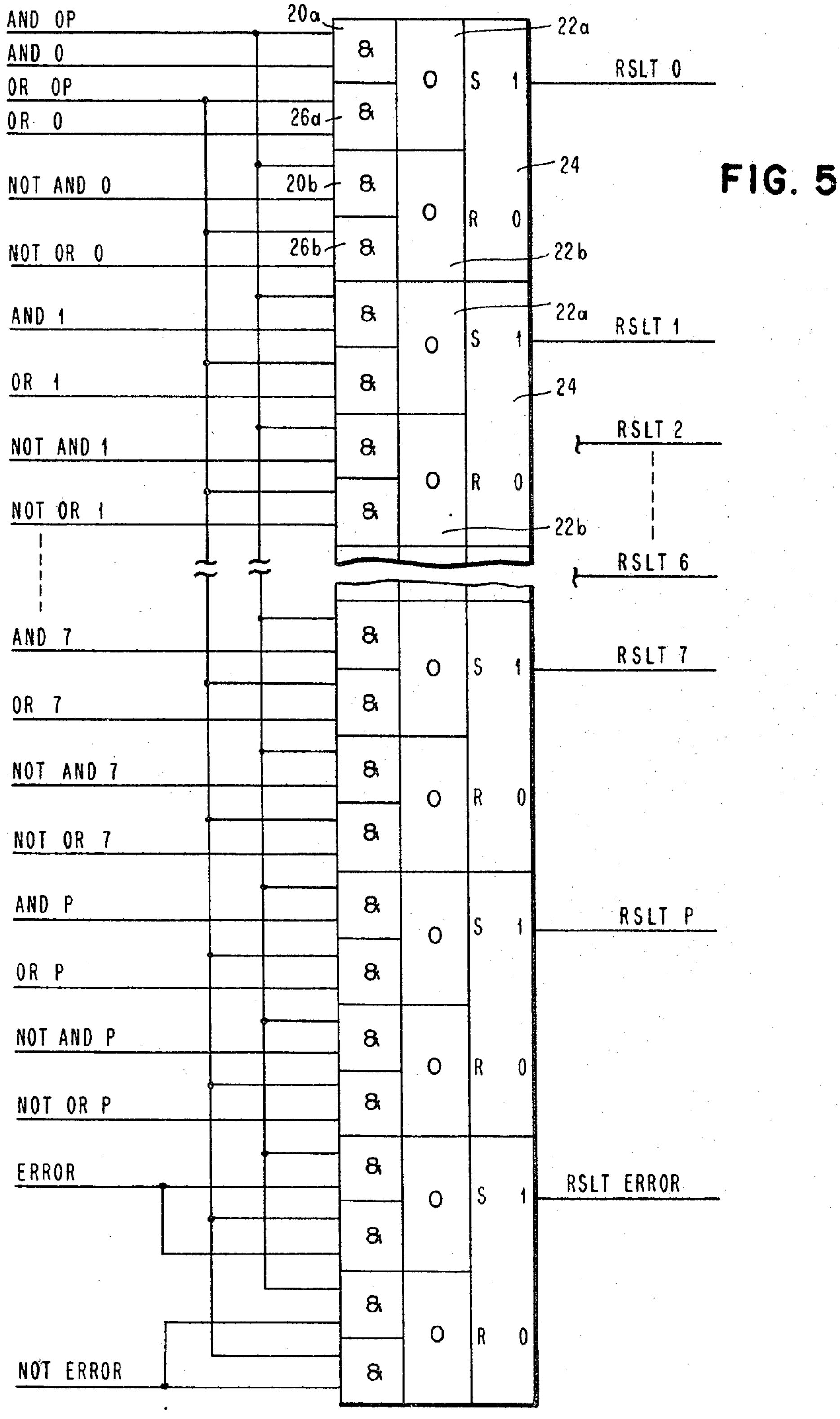
FIG. 5 is a schematic block diagram of a result register for the embodiment of FIG. 1.

The result register shown in FIG. 5 comprises a plurality of latches 24, one for each data bit, one for the parity bit, and if desired, one for the error itself. Each of the latches 24 will either be set or reset by a corresponding AND bit or a corresponding OR bit, as determined by whether an AND operation or an OR operation is involved. During an AND operation, the AND circuits 20*a*, 20*b* will respond to the outputs (and the complements of the outputs) of the AND circuits 10. During an OR operation, the outputs of the OR circuits 12 will cause operation of the AND circuits 26*a*, 26*b*, alternatively, in dependence upon whether each bit is a 1 or a 0. Thus, whatever results are obtained, and the related parity bit, may be selected for registering in the latches 24.

The concept of the invention is illustrated for three-bit operands in the table of FIG. 6. As an example, an X value of 011 (with a parity bit P) is shown in column *d* of the table. A Y value of 100 (no parity) is shown in row E. The result of the OR of these values is shown above the result of the AND of these values at the intersection of column *d* with row E: the OR result is 111 (no parity) and the AND result is 000 (with a parity bit, P). Thus X and the AND have parity, Y and the OR do not; the parity is even (TWO), and there is no error. Other examples may be taken, and it will become clear that the total number of correct parity bits is always an even number (ZERO, TWO or FOUR, in the table). Any case where an odd number of parities exists is therefore due to faulty circuit operation and is an error.

Figure 2:
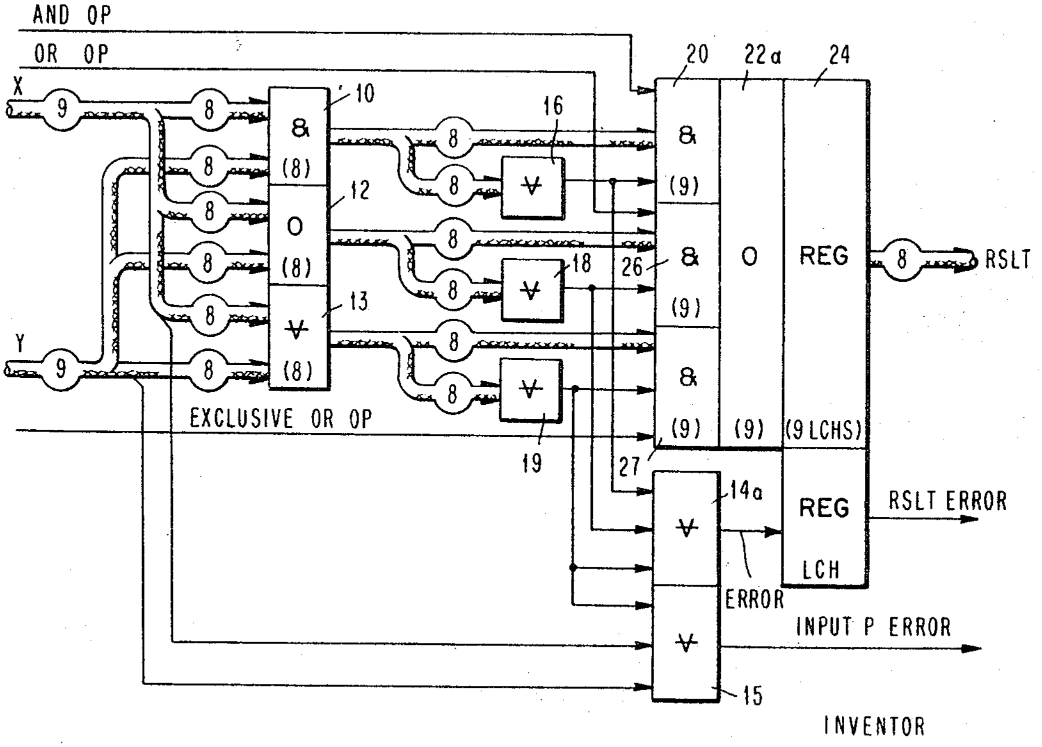
FIG. 2 is a schematic block diagram of an alternative embodiment of the present invention.

An alternative embodiment of the invention is shown in FIG. 2. The differences between FIG. 2 and FIG. 1 include a plurality of EXCLUSIVE OR circuits 13 which are provided to generate the EXCLUSIVE OR logical function of corresponding bits of the input operands. Also, a corresponding parity generating EXCLUSIVE OR circuit 19 is provided. Additionally, input gating AND circuits 27 are provided so as to be able to select the EXCLUSIVE OR result to be fed into the latches 24 of the result register. Another difference is that, since the output of the EXCLUSIVE OR circuit 19 represents the total parity of the input operands, it is equivalent to the parity of the two parity bits which accompany the operands. Therefore, the output of the EXCLUSIVE OR circuit 19 is applied to an EXCLUSIVE OR circuit 14*a* (which corresponds to the EXCLUSIVE OR circuit 14 shown in FIG. 1) for generating the error signal. In this embodiment, it is also possible to check the correctness of the output of the EXCLUSIVE OR circuit 19 by comparing it against the parity of the two input parity bits in an EXCLUSIVE OR circuit 15. This is an additional check, which might be considered to be a check on the input parity, and the output of the EXCLUSIVE OR circuit 15 has therefore been termed "input parity error." The EXCLUSIVE OR circuit 15 will generate an error signal if there is an output from the EXCLUSIVE OR circuit 19 when the input parity bits are alike. The details of the hardware of the embodiment shown in FIG. 2 are obvious in view of the full description of the embodiment of FIG. 1.

While the invention has been shown and described with respect to a preferred embodiment thereof, it should be apparent to those skilled in the art that various changes and omissions in the form and detail thereof may be made therein without departing from the spirit and scope of the invention, which is to be limited only as set forth in the following claims.

What is claimed is:

1. A circuit for performing logical combinations of a pair of input operands and for checking said combinations, comprising:

a pair of sources, each providing manifestations of operands each operand comprising a plurality of data bit manifestations, each source also providing a parity manifestation for the corresponding operand;

a plurality of AND means, one for each of the bit manifestations in one of said operands, each responsive to corresponding bit manifestations of both of said operands so as to provide the logical AND of a related pair of bit manifestations;

a plurality of OR means, one for each bit manifestation in one of said operands, each responsive to corresponding bit manifestations of both of said operands so as to provide the logical OR of a corresponding pair of bit manifestations;

first and second parity generating means, said first parity generating means generating the parity of the outputs of said AND means and said second parity generating means generating the parity of the outputs of said OR means;

and error means responsive to a parity manifestation of each of said sources and to the parity generated by each of said parity generating means, said error means generating an error signal in response to an odd number of inputs thereto.

2. The device described in claim 1 additionally comprising:

a result register;

and means for selecting the output of each of said AND means or of each of said OR means, alternatively, for application to said result register.

3. The device described in claim 2 additionally comprising means for selecting the parity manifestation of said first parity generating means or of said second parity generating means, alternatively, for application to said result register.

4. A circuit for performing logical combinations of a pair of input operands and for checking said combinations, comprising:

a pair of sources, each providing manifestations of operands, each operand comprising a plurality of data bit manifestations;

a plurality of AND means one for each of the bit manifestations in one of said operands, each responsive to corresponding bit manifestations of both of said operands so as to provide the logical AND of a related pair of bit manifestations;

a plurality of OR means, one for each bit manifestation in one of said operands, each responsive to corresponding bit manifestations in both of said operands so as to provide the logical OR of a corresponding pair of bit manifestations;

a plurality of EXCLUSIVE OR means, one for each bit manifestation in one of said operands, each responsive to corresponding bit manifestations of both of said operands so as to provide the logical EXCLUSIVE OR of a corresponding pair of bit manifestations;

first, second and third parity generating means, said first parity generating means generating the parity of the outputs of said AND means, said second parity generating means generating the parity of the outputs of said OR means, and said third parity generating means generating the parity of the outputs of said EXCLUSIVE OR means;

and error means responsive to the parities generated by each of said parity generating means to generate an error signal in response to an odd number of inputs thereto.

5. The device described in claim 4 wherein each source also provides a parity manifestation for the corresponding operand, said device additionally comprising parity error means responsive to a parity manifestation of each of said sources and to the parity generated by said third parity generating means to generate an input parity error signal in response to an odd number of inputs thereto.

6. The device described in claim 4 additionally comprising:

a result register;

and means for selecting the outputs of said AND means, said OR means, or said EXCLUSIVE OR means, alternatively, for application to said result register.

7. The device described in claim 6 additionally comprising means for selecting the parity manifestation of said first parity generating means, of said second parity generating means, or of said third parity generating means, alternatively, for application to said result register.

References Cited

UNITED STATES PATENTS

| | | | |
|---|---|---|---|
| 2,837,278 | 6/1958 | Schreiner et al. | 235—153 X |
| 2,875,951 | 3/1959 | Schreiner | 235—153 |
| 3,011,151 | 11/1961 | Ketchledge | 340—146.1 |
| 3,114,130 | 12/1963 | Abramson | 235—153 X |
| 3,188,609 | 6/1965 | Harmon et al. | 235—153 X |
| 3,196,259 | 7/1965 | Erickson | 235—153 |

MALCOLM A. MORRISON, Primary Examiner

R. STEPHEN DILDINE, Jr., Assistant Examiner